United States Patent
Farber et al.

(10) Patent No.: US 6,917,214 B2
(45) Date of Patent: Jul. 12, 2005

(54) METHOD FOR TESTING A PLURALITY OF DEVICES DISPOSED ON A WAFER AND CONNECTED BY A COMMON DATA LINE

(75) Inventors: Gerrit Farber, Freiburg (DE); Martin Fritz, München (DE); Jens Möckel, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/278,227

(22) Filed: Oct. 23, 2002

(65) Prior Publication Data

US 2003/0076127 A1 Apr. 24, 2003

(30) Foreign Application Priority Data

Oct. 23, 2001 (DE) .......................... 101 52 086

(51) Int. Cl.⁷ .............................................. G01R 31/26
(52) U.S. Cl. .................................. 324/765; 324/158.1
(58) Field of Search ........................... 324/765, 158.1; 438/5, 10, 12, 14, 17–18; 257/529, 530; 365/201

(56) References Cited

U.S. PATENT DOCUMENTS

| | | | |
|---|---|---|---|
| 4,281,449 A | 8/1981 | Ports et al. .................. 29/593 |
| 5,325,334 A | * 6/1994 | Roh et al. .................. 365/201 |
| 5,389,556 A | * 2/1995 | Rostoker et al. .............. 438/17 |
| 5,446,310 A | * 8/1995 | Baliga et al. ................ 257/529 |

FOREIGN PATENT DOCUMENTS

| DE | 44 00 118 A1 | 7/1995 |
|---|---|---|
| DE | 197 07 312 A1 | 8/1998 |
| EP | 0 494 782 A1 | 7/1992 |

\* cited by examiner

*Primary Examiner*—Vinh Nguyen
*Assistant Examiner*—Russell M. Kobert
(74) *Attorney, Agent, or Firm*—Laurence A. Greenberg; Werner H. Stemer; Ralph E. Locher

(57) ABSTRACT

In a method for testing a plurality of devices, which are arranged on a wafer and connected to a common data line, wherein the devices are connectable to a test unit via the common data line, a connection is separated first between a defective device and the common data line, or an internal connection in the defective device is separated. Subsequently, the remaining devices are tested. Alternatively, instead of the connection between the defective device and the common data line, the connection between a defective device and a common or an individual supply line is separated.

6 Claims, 3 Drawing Sheets

METHOD FOR TESTING A PLURALITY OF DEVICES DISPOSED ON A WAFER AND CONNECTED BY A COMMON DATA LINE

BACKGROUND OF THE INVENTION

1. Field of the Invention

The present invention relates to a method for testing a plurality of devices, and in particular, to a method for testing a plurality of devices arranged on a wafer such that yield losses during electrical tests on a wafer level are strongly minimized.

2. Description of the Related Art

FIG. 1 shows an example of a wafer 100, on which a multitude of devices or chips 102 is formed, wherein, in FIG. 1, only examples of individual ones of the devices 102, which are suggested by the squares, are provided with this reference number to maintain the clarity of the drawing. The individual devices/chips 102 each include inputs and outputs as well as supply terminals, which, as long as the devices/chips 102 have not been diced, are connected via a common contact element (e.g. a probe card, PCE, etc.) or also on the wafer, resulting in common data lines for input and output signals.

Further, supply lines (ground, supply voltage, etc.) are provided for the devices/chips 102, for example in the contact element or on the wafer (not shown in FIG. 1). In accordance with an example, each of the devices/chips 102 is assigned as supply line. Alternatively, several devices/chips 102 on the wafer are connected to a common supply line such that a region on the wafer will be supplied by a supply line. The supply lines provide the devices/chips 102 located on the wafer with the potentials required for their operation, wherein the term supply line refers to both a voltage-conducting line and a ground line. This enables to simultaneously test a plurality of devices/chips, as will be explained in more detail below.

The testing means, as it is eg known from conventional wafer tests, divides the wafer 100, depending on the number of the available input/output channels of a test unit, into a predetermined number of areas, as an example in FIG. 1, into four areas I, II, III, IV, which, in FIG. 1, for example, each include a predetermined number of devices/chips 102 in three columns. The test unit, which is not illustrated in more detail, further includes one or more data buses 104, in the example with a first data line 104a, a second data line 104b and a third data line 104c, serving to receive data signals from the individual columns on the wafer 100 or to provide them to the same.

In area I, the devices/chips of the first column are connected to the third data line 104c. The devices/chips in the second column are connected to the first data line 104a. In the remaining areas II to IV, the devices/chips in the first column are connected to the second data line 104b, the devices/chips in the second column to the third data line 104c, and the devices/chips in the third column are connected to the first data line 104a.

In the embodiment shown in FIG. 1, eleven consecutive rows, as suggested by the eleven horizontal arrows 106, are measured, wherein, however, the testers used comprise only four input/output channels such that, in each row, a maximum of four devices/chips 102 may be simultaneously measured/tested. Alternatively, more input/output channels may be provided, with which more devices/chips 102 may be simultaneously measured/tested. The selection of the devices/chips to be measured will be effected via applying a selection signal (CHIP_SELECT) to the corresponding row (arrows 106) and by activating selected data lines. FIG. 1 shows an example of the state, when already five rows have been passed, such that the selection signal is now only to be provided to the row 107. By applying the selection signal to the row 107 and by activating the data line 104a of the data bus 104, the device 108 in the second column in the area I and the devices 110, 112, 114 in the third column of the areas II to IV are selected for a test. Analogously, the activation of the data line 104b would cause the devices in the first column of the areas II to IV to be selected, and the activation of the data line 104c would cause the devices in the first column of the area I as well as in the second columns of the areas II to IV to be selected.

In order to be able to simultaneously measure as many chips as possible on a wafer, more or less devices/chips 102, depending on the number of available channels of the tester, are integrated in groups, as described above.

A disadvantage of the above-described procedure becomes manifest when one of the chips 102 to be tested is defective. In FIG. 1, examples of the four single chips 108, 110, 112 and 114 are illustrated, which are examined in a row, when a selection signal is applied. Now assume that the device/chip 112 is defective, as is made clear by the sign "X". The error of the device may refer to fabrication-related errors resulting in short-circuits to ground or to an operating voltage within the device 112,. The disadvantage in the above-described procedure is that, on the basis of these short-circuits, the inputs or outputs of the other directly connected chips 108, 110, 114 are also tied to the corresponding potential, and it is thus impossible to conduct convincing measurements. Thus, all devices/chips 108, 110, 112, 114 connected in this measurement will be lost, since their functionality may not be tested, and these devices will be completely rejected as erroneous, which clearly reduces the yield.

FIG. 2 schematically illustrates once more the examination of the devices 108 to 114. A tester 106 is schematically shown, which applies the input signals required for the tests to the devices 108 to 114 across the resistor R and which receives output signals from these devices 108 to 114 and forwards them to an assessment means to examine and classify the functionality of the tested devices 108 to 114. In the illustrated embodiment, the tester 116 has a functionality, which enables the same to handle for channels (I/O-channels) at a time, i. e. to simultaneously provide four devices with signals and to receive output signals from the same.

FIG. 2 schematically shows a common data line 118, which is formed in the contact element or on the wafer, with which the individual devices 108 to 114 are connected on the wafer via data lines 108a to 114a. The tester 116 is connected eg via the contact element or directly to the wafer 100, and, in this case, to the common data line 118, to perform the corresponding measurements. The data line 118, which is schematically illustrated in FIG. 4, is for example the activated common data line 104a of the data bus 104, which is shown in FIG. 1. If, on the basis of a defect in the device 112, the data line 112a of the same is grounded or is at another operating potential, the remaining devices 108, 110, 114 are also brought to this potential on the basis of this connection. Therefore, a convincing measurement is no longer possible, and the reduction in yield already been mentioned above, which is due to the missing determinability of the functionality of the devices 108 to 114, is caused.

To avoid these problems, certain electrical tests of the devices/chips 102 were not carried out on a wafer level so far. Instead, the individual devices were first diced, and then the corresponding test was carried out on a device level. Storage elements, which are eg equipped with laser fuses, were also not submitted to the related burn-in process on the wafer level, but, as well, first on the device level. This way, the prior art ensured that, in a test, only known, functioning devices/chips were used such that practically no yield loss exists, since, on the one hand, building blocks with internal short-circuits do only seldomly occur, and, on the one hand, they may be exchanged after a preliminary test. However, this is only possible, since the building blocks have already been diced; but this is not possible on the wafer level.

A further possibility of solving the problem on the wafer level is to mask defective devices/chips, which, however, is only possible by covering the contacts or the entire device with an insulating layer. Applying the insulating layer in this way, however, represents an additional and cost-intensive step, which stands in no relation to the enhanced yield, and which, therefore, should be avoided, if possible.

Based on this state of the art, the present invention is based on the objective of providing a method for testing devices on a wafer level, which reduces the yield losses in such electrical tests on wafer level.

SUMMERY OF THE INVENTION

The present invention is a method for testing a plurality of devices, which are arranged on a wafer and which are connected to a common data line, wherein the devices are connectable to a test unit via the common data line, with the method having the following steps:

(a) separating a connection between a defective device and the common data line, or an internal connection in the defective device; and (b) testing the remaining devices.

In accordance with a preferred embodiment of the present invention, the devices are further connected to a supply line, and, in step (a), a connection between a defective device and a common supply line is further separated.

The present invention further is a method for testing a plurality of devices, which are arranged on a wafer and which are connected to a common data line, wherein the devices are connectable to a test unit via the common data line, and wherein the plurality of devices is further connected to a supply line, the method having the following steps:

(a) separating a connection between a defective device and the supply line, or an internal connection in the defective device; and (b) testing the remaining devices.

Preferably, the inventive method additionally includes the step of determining defective devices on the wafer. Furthermore, in step (a), when separating the internal connection of a device, the input and/or the output of the defective device is preferably separated.

Preferably, the separating process is carried out by using a laser.

The testing of the devices includes applying a test signal to the common line, receiving a response signal, and assessing the response signal.

In accordance with a preferred embodiment, the present invention is used in a method for testing storage chips, and, in such a method, the defective devices/storage chips become known by a first wafer test or a by a simple preliminary test.

As a rule, it can not be guaranteed, that, in storage devices, all of the storage cells are operable, and, in fact, there is always a number of non-functioning storage cells to be found, which are then replaced by intended, redundant storage cells. This "repair" of the storage chips is effected by using so-called laser fuses, which are used for reprogramming the storage cells, i. e. for replacing defective storage cells by redundant storage cells.

In accordance with the present invention, use is preferably made of the laser process, which is used anyway to repair these devices/chips, and, during this process, any required contacts of a defective element are opened directly on the chip or on the re-routing level disposed on the wafer. In the simplest case, an individual, affected input or output of a device is separated in accordance with the present invention. The separating process may also be effected immediately at or behind the applied re-routing contact.

In accordance with a further embodiment of the present invention, an additional laser process may be provided, in which, by means of a simple laser trimmer or of a special laser, the corresponding lines are opened.

BRIEF DESCRIPTION OF THE DRAWINGS

Preferred embodiments of the present application will be explained in detail below with reference to the attached drawings, in which.

DESCRIPTION OF THE PREFERRED EMBODIMENTS

Figure 1:
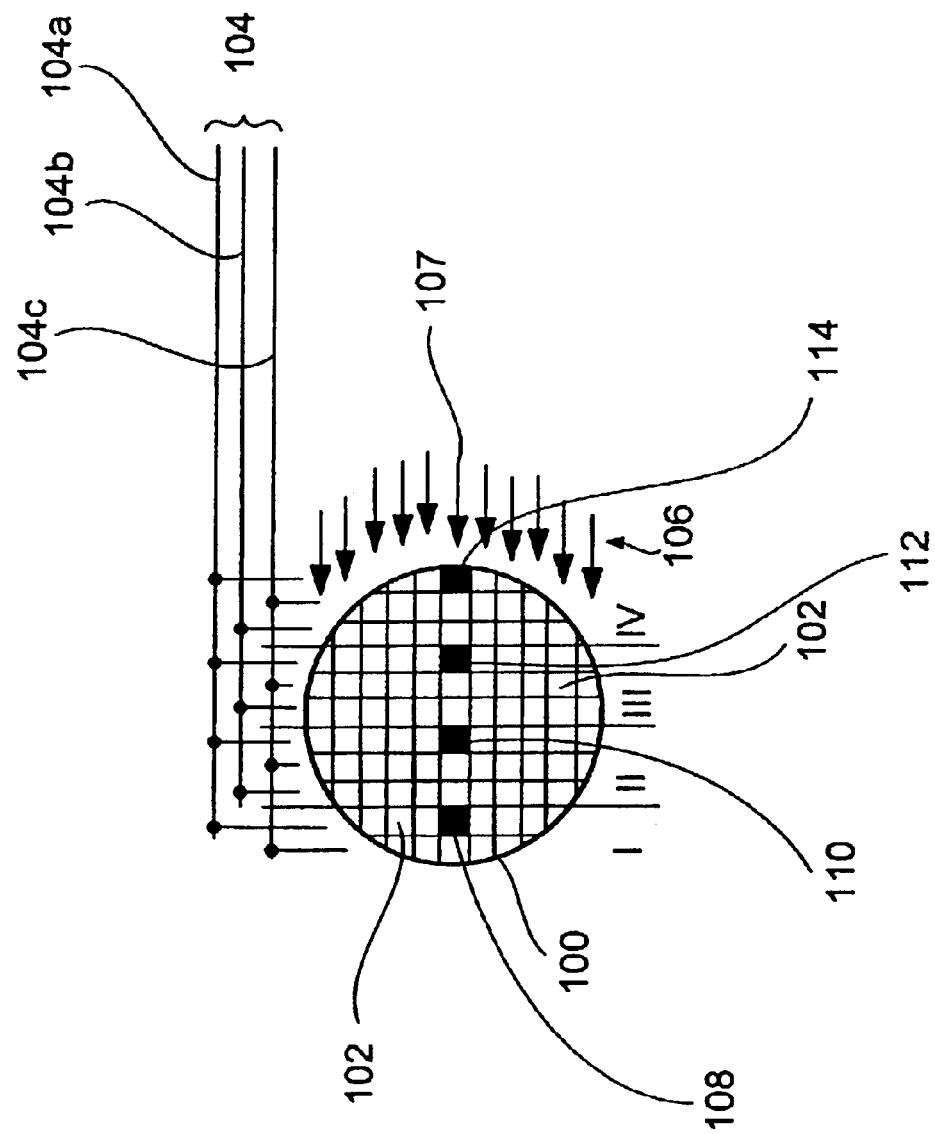
FIG. 1 shows a schematic illustration of a wafer with an assigned test unit.
Figure 3:
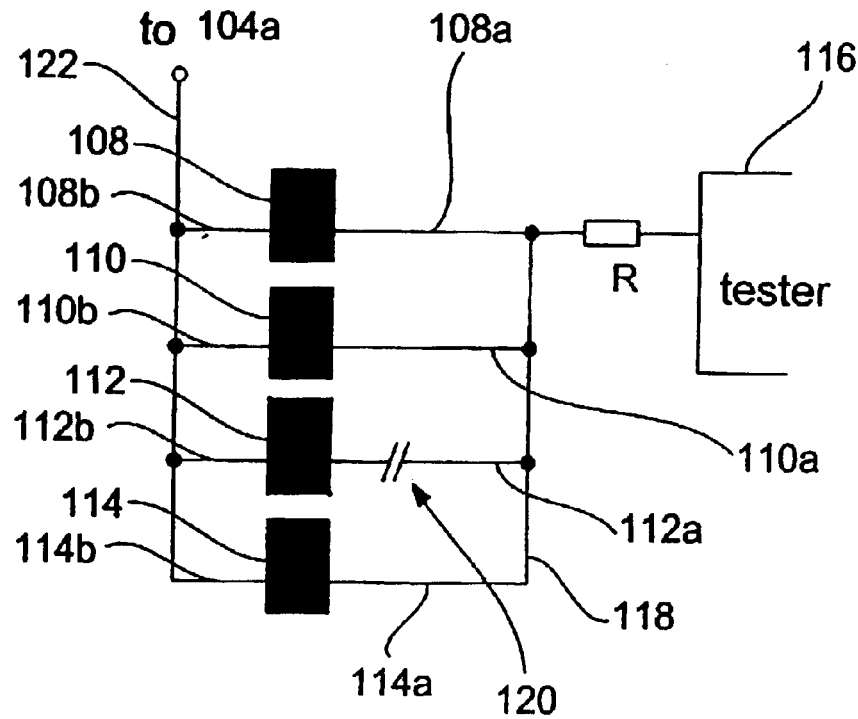
FIG. 3 shows a schematic illustration to clarify a test method for testing four devices in accordance with a first embodiment of the present invention.
Figure 4:
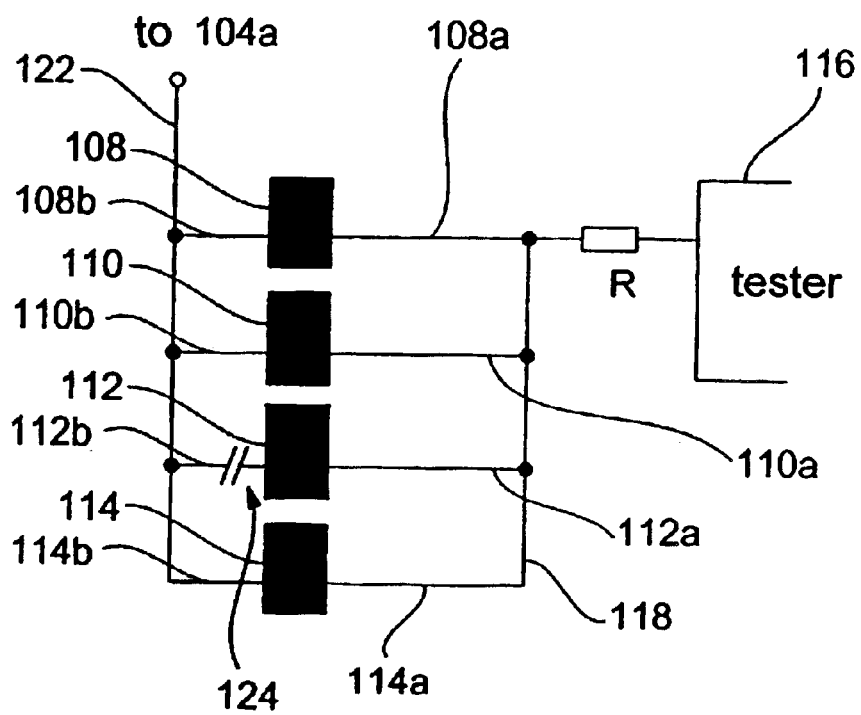
FIG. 4 shows a schematic illustration of a test method for testing four devices in accordance with a second embodiment of the present invention.

By means of FIG. 3, a first embodiment of the present method will be explained in detail below. In FIG. 3, an illustration similar to FIG. 4 is shown, in which the devices 108 to 114 shown in FIG. 1 are tested by accordingly activating the data bus 104 and connecting to the tester 116 via the common data line 118. Once more, it is to be assumed that the device 112 is defective, e.g. forms a short-circuit against the ground or a supply potential. To prevent the defective device 112 from tying the remaining devices 108, 110, and 114 to the ground potential and/or supply potential, so that no comprehendible test results may be achieved in the following examination, the data line 112a (connection line) between the device 112 and the common data line 118 is separated in accordance with the invention, e.g. by laser trimming or other suitable methods, as is shown at 120.

Further, in FIG. 3, the supply of the individual devices 108 to 114 is schematically shown. Via the supply lines 108b, 110b, 112b, 114b, the devices 108 to 114 are connected to a common supply line 122, which is formed e.g. in the contact element or on the wafer.

In the embodiment of the inventive method illustrated in FIG. 3, the same operates on a selective basis, and only individual data lines (data line 112a), i. e. no intact chips, are separated. In this case, it is possible, during the measurement, to continue the operation of the devices/chips separated from the common data line 118, which is particularly advantageous, when a regular temperature distribution or electrical power distribution has to be achieved on the wafer, as it is required e.g. in a wafer level burn-in process. If such a further supply of defective chips/devices with a supply power is undesirable, it is possible to additionally separate the connection between the defective chips, e.g. the supply line 112b, to the common supply line 122.

Figure 2:
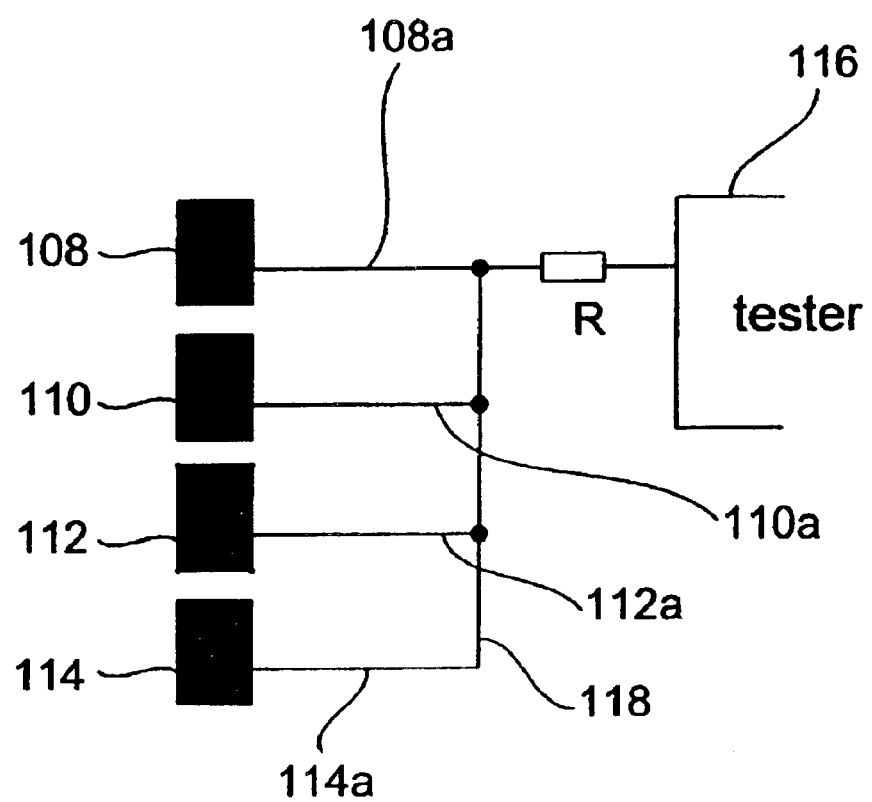
FIG. 2 shows an arrangement to clarify a conventional test method of four devices.

By way of FIG. 4, a further embodiment of the present invention will be explained in detail below, wherein identical elements, which have already been described with reference to FIG. 2 or 3, comprise identical reference numbers and will not be described once more.

As can be recognized from a comparison of FIG. 3 and 4, the embodiment described in FIG. 4 distinguishes itself from the embodiment described in FIG. 3 in that, instead of the data line 112a between the defective device 112 and the common data line 118, now only the line 112b is separated between the device 112 and the common supply line 122, as is shown at 124. Here, the separating operation also ensures that the defective device, which has been short-circuited to the supply line, does not tie the remaining devices 108, 110, 112 to this potential, such that, despite the defective device 112, it is still possible to achieve a convincing measurement result.

As an alternative to the separation 120, 124 of the connections 112a or 112b, which has been described in FIG. 3 and 4, it is also possible to separate an internal connection in the defective device 112 in accordance with the present invention, in order to avoid a short-circuit of an input of the device 112 against the ground or another reference potential. Preferably, when processing the device 112 itself, the input and/or the output of the chip concerned are processed, as is here the case with the chip/device 112.

In accordance with a preferred embodiment of the present invention, this application is used in a method for testing storage devices, in which a laser process for the processing of the laser fuses, e.g. the repair of storage chips, is carried out, and in which the defective chips are already known. If the inventive method for testing such chips is employed, its realization is practically feasible without making any additional expenditures, since, here, the required processes have already been provided for and may be combined in an advantageous manner.

Since the processing of laser fuses under certain conditions requires different laser process parameters than the separation of the lines described above, it is provided in accordance with an embodiment that the laser parameters are adjustable during the process.

The advantage of the present invention is that possible short-circuits between interconnected inputs or outputs of devices may be avoided such that, during measurement, the yield is significantly increased. In other words, the devices, which have been rejected as defective in accordance with conventional methods, may now be measured correctly and may be classified as defective or defect-free in accordance with the measuring results, which results in the enhanced yield.

Although certain embodiments, in which the devices are storage devices, have been addressed above, the present invention is, of course, not limited to these embodiments. Instead of the described laser processes for separating the connections, other suitable processes may, of course, also be consulted.

What is claimed is:

1. A method for testing a plurality of devices, the devices being arranged on a wafer, connected to a common data line, and connected to a common supply line for applying a supply power, wherein the devices, via the common data line, are connectable to a test unit, the method comprising:

(a) determining defective devices on the wafer;

(b) separating a connection between defective device and the common data line;

(c) applying to all of the devices the supply power distribution across the wafer during subsequent testing via the common supply line for achieving a regular temperature distribution; and (d) testing the remaining, non-defective devices.

2. The method in accordance with claim 1, wherein the plurality of devices are connected to a supply line, wherein the step (a) further includes separating of a connection between a defective device and the supply line.

3. The method in accordance with claim 2, wherein each of the devices on the wafer comprises a supply line or wherein several of the devices comprise a common supply line.

4. The method in accordance with claim 1, wherein, in step (a), an input and/or an output of the defective devices is separated.

5. The method in accordance with claim 1, wherein the separating process is carried out by using laser energy.

6. The method in accordance with claim 1, wherein the step (d) includes applying a test signal to the common data line, receiving a response signal from the devices, and assessing the response signal.

* * * * *